(12) United States Patent
Huang et al.

(10) Patent No.: US 8,237,187 B2
(45) Date of Patent: Aug. 7, 2012

(54) PACKAGE STRUCTURE FOR CHIP AND METHOD FOR FORMING THE SAME

(76) Inventors: Tien-Hao Huang, Jhongli (TW); Shang-Yi Wu, Hsinchu (TW)

(*) Notice: Subject to any disclaimer, the term of this patent is extended or adjusted under 35 U.S.C. 154(b) by 13 days.

(21) Appl. No.: 12/636,660

(22) Filed: Dec. 11, 2009

(65) Prior Publication Data
US 2010/0148210 A1    Jun. 17, 2010

Related U.S. Application Data

(60) Provisional application No. 61/121,880, filed on Dec. 11, 2008.

(51) Int. Cl.
H01L 29/22    (2006.01)
H01L 23/52    (2006.01)
H01L 29/40    (2006.01)
H01L 33/00    (2010.01)

(52) U.S. Cl. .... 257/99; 257/774; 257/621; 257/E33.058
(58) Field of Classification Search ..................... 257/99, 257/774, 621, E33.058
See application file for complete search history.

(56) References Cited

U.S. PATENT DOCUMENTS

| | | | |
|---|---|---|---|
| 4,843,280 A * | 6/1989 | Lumbard et al. | 313/500 |
| 6,699,787 B2 * | 3/2004 | Mashino et al. | 438/667 |
| 6,873,054 B2 * | 3/2005 | Miyazawa et al. | 257/774 |
| 6,908,856 B2 * | 6/2005 | Beyne et al. | 438/667 |
| 6,958,544 B2 * | 10/2005 | Sunohara | 257/758 |
| 7,737,562 B2 | 6/2010 | Higaki et al. | |
| 7,786,008 B2 * | 8/2010 | Do et al. | 438/667 |
| 7,851,817 B2 * | 12/2010 | Yasuda et al. | 257/98 |
| 2001/0008794 A1 * | 7/2001 | Akagawa | 438/620 |
| 2002/0127839 A1 * | 9/2002 | Umetsu et al. | 438/618 |
| 2005/0146049 A1 * | 7/2005 | Kripesh et al. | 257/776 |
| 2009/0108411 A1 * | 4/2009 | Shiraishi et al. | 257/621 |

FOREIGN PATENT DOCUMENTS

| | | |
|---|---|---|
| CN | 1930680 | 3/2007 |
| TW | 200744230 | 12/2007 |

* cited by examiner

*Primary Examiner* — Luan C Thai
(74) *Attorney, Agent, or Firm* — Liu & Liu

(57) ABSTRACT

An embodiment of the invention provides a package structure for chip. The package structure for chip includes: a carrier substrate having an upper surface and an opposite lower surface; a chip overlying the carrier substrate and having a first surface and an opposite second surface facing the upper surface, wherein the chip includes a first electrode and a second electrode; a first conducting structure overlying the carrier substrate and electrically connecting the first electrode; a second conducting structure overlying the carrier substrate and electrically connecting the second electrode; a first through-hole penetrating the upper surface and the lower surface of the carrier substrate and disposed next to the chip without overlapping the chip; a first conducting layer overlying a sidewall of the first through-hole and electrically connecting the first conducting electrode; and a third conducting structure overlying the carrier substrate and electrically connecting the second conducting structure.

20 Claims, 16 Drawing Sheets

PACKAGE STRUCTURE FOR CHIP AND METHOD FOR FORMING THE SAME

CROSS REFERENCE TO RELATED APPLICATIONS

This Application claims the benefit of U.S. Provisional Application No. 61/121,880, filed on Dec. 11, 2008, the entirety of which is incorporated by reference herein.

BACKGROUND OF THE INVENTION

1. Field of the Invention

The present invention relates to a package structure for chip and method for forming the same, and in particular relates to a package of a light emitting chip.

2. Description of the Related Art

The chip packaging process is one of the important processes for forming chips. A package structure for chip, not only provides a connecting interface for chips and electronic elements, but also provides chips with protection from environmental contaminants, among other functions.

Typically, a light emitting chip is disposed on a printed circuit board and a bonding process may be performed to accomplish packaging of the light emitting chip. However, heat dissipation and throughput of the light emitting chip package still need to be improved.

Thus, a novel package structure for improving the package of chips and method for forming the same is desired.

BRIEF SUMMARY OF THE INVENTION

According to an illustrative embodiment, a package structure for chip is provided. The package structure for chip comprises: a carrier substrate having an upper surface and an opposite lower surface; a chip overlying the carrier substrate and having a first surface and an opposite second surface facing the upper surface, wherein the chip comprises a first electrode and a second electrode; a first conducting structure overlying the carrier substrate and electrically connecting the first electrode; a second conducting structure overlying the carrier substrate and electrically connecting the second electrode; a first through-hole comprising a stacked hole and penetrating the upper surface and the lower surface of the carrier substrate and disposed next to the chip; a first conducting layer overlying a sidewall of the first through-hole and electrically connecting the first conducting electrode; and a third conducting structure comprising a second through-hole and overlying the carrier substrate and electrically connecting the second conducting structure.

According to another illustrative embodiment, a method for forming a package structure for chip is provided. The method for forming a package structure for chip comprises: providing a carrier substrate having an upper surface and an opposite lower surface; forming a stacked hole serving as a first through-hole, the first through-hole penetrating the upper surface and the lower surface; forming a first conducting layer overlying a sidewall of the first through-hole; forming a third conducting structure comprising a second through-hole and overlying the carrier substrate; disposing a chip overlying the carrier substrate, wherein the chip has a first surface and an opposite second surface facing the upper surface and comprises a first electrode and a second electrode; forming a first conducting structure overlying the carrier substrate and electrically connecting the first electrode and the first conducting layer; and forming a second conducting structure overlying the carrier substrate and electrically connecting the second electrode and the third conducting structure.

According to another illustrative embodiment, a method for forming a package structure for chip is provided. The method for forming a package structure for chip comprises: providing a semiconductor wafer having an upper surface and an opposite lower surface; forming a stacked hole serving as a first through-hole penetrating the upper surface and the lower surface of the semiconductor wafer; forming a first conducting layer overlying a sidewall of the first through-hole; forming a third conducting structure overlying the semiconductor wafer and comprising a second through-hole; dicing the semiconductor wafer to form a plurality of carrier substrates for packaging; disposing a light emitting chip over one of the carrier substrates, wherein the light emitting chip has a first surface and an opposite second surface facing the upper surface and comprises a first electrode and a second electrode; forming a first conducting structure overlying the carrier substrate and electrically connecting the first electrode and the first conducting layer; and forming a second conducting structure overlying the carrier substrate and electrically connecting the second electrode and the third conducting structure.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

In embodiments of the invention, a wafer-level process may be adopted to form a carrier substrate for a light emitting chip. Through a through-substrate via, a conducting path connected to the light emitting chip is led to other plane of the package.

Figure 1A:
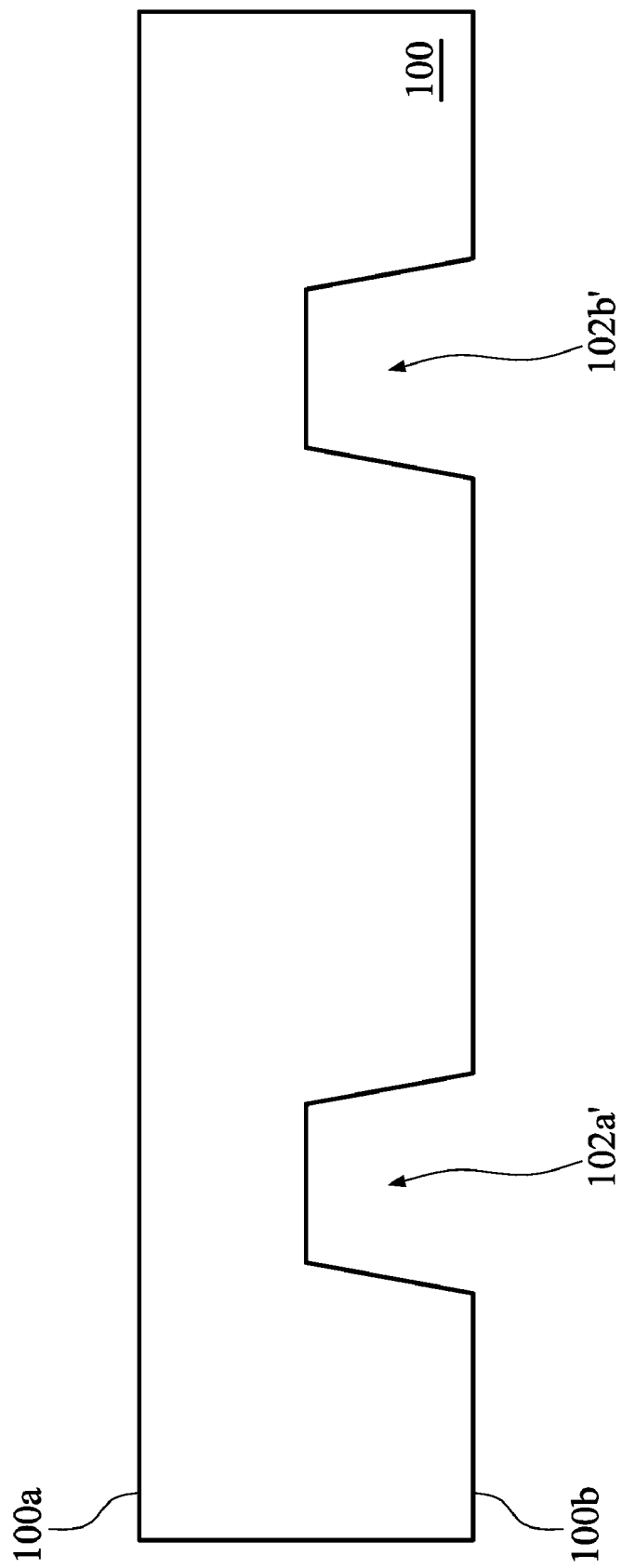
FIGS. 1A-1F are cross-sectional views showing the steps for forming a package structure for chip in accordance with an embodiment of the present invention.

FIGS. 1A-1F show cross-sectional views for illustrating the steps for forming a package structure for chip in accordance with an embodiment of the present invention. First, as shown in FIG. 1A, a carrier substrate 100 having an upper surface 100*a* and an opposite lower surface 100*b* is provided. The carrier substrate 100 may include a silicon substrate, a semiconductor substrate, a compound semiconductor substrate, a semiconductor wafer, a sapphire substrate, an insulating substrate, or combinations thereof.

Next, holes 102*a*' and 102*b*' penetrating through the carrier substrate 100 are formed from the lower surface 100*b* to a predetermined depth. Bottom portions of the holes 102*a*' and 102b' expose the carrier substrate 100. In other embodiments, the chip may be disposed first, and then the holes 102a' and 102b' are formed next to the chip.

Figure 1B:
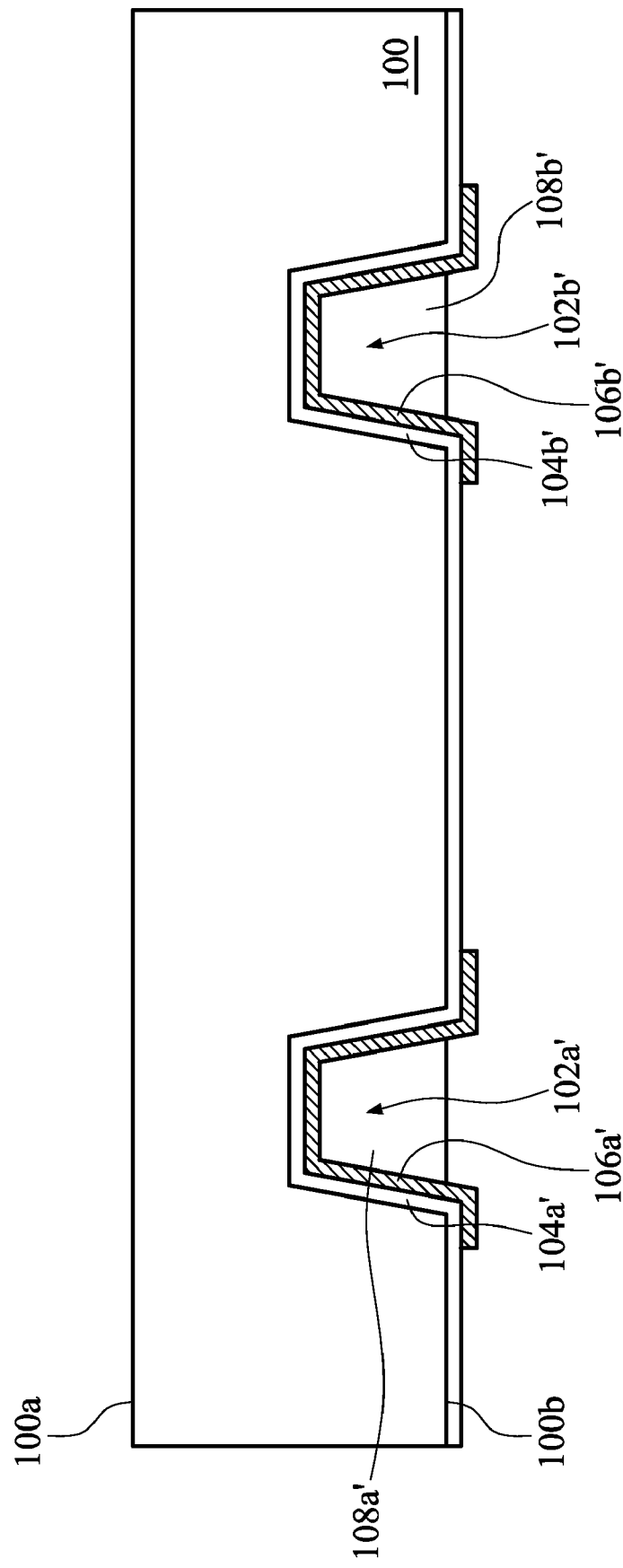

Referring to FIG. 1B, insulating layers 104a' and 104b' are optionally formed overlying sidewalls of the holes 102a' and 102b' and portions of the carrier substrate 100, respectively. The material of the insulating layers 104a' and 104b' may be, for example, an epoxy resin, a solder mask material, or other suitable insulating materials, such as inorganic materials including silicon oxide, silicon nitride, silicon oxynitride, metal oxide, or combinations thereof, or organic polymer materials including polyimide, butylcyclobutene (BCB, Dow Chemical Co.), parylene, polynaphthalenes, fluorocarbons, or acrylates and so on. The insulating layer 104 may be formed by a coating process, such as spin coating, spray coating, or curtain coating process, or other suitable deposition methods, such as liquid phase deposition, physical vapor deposition, chemical vapor deposition, low pressure chemical vapor deposition, plasma enhanced chemical vapor deposition, rapid thermal chemical vapor deposition, or atmospheric pressure vapor deposition. In an embodiment, the insulating layers 104a' and 104b' are preferably photoresist materials so that the insulating layers may be more easily patterned. In this embodiment, the insulating layers 104a' and 104b' are preferably formed simultaneously. In other cases, if the carrier substrate is an insulating substrate, the deposition process of the insulating layers before forming the conducting layer may be omitted.

Still referring to FIG. 1B, hole conducting layers 106a' and 1906b' are then formed overlying the sidewalls of the holes 102a' and 102b', respectively. The hole conducting layers 106a' and 106b' are further extended over the lower surface 100b of the carrier substrate 100, which may be used as a conducting route between the package structure for chip and other electrical elements outside of the package structure. For example, the hole conducting layers 106a' and 106b' extending over the lower surface 100b may further electrically connect other electrical elements, for example a printed circuit board, outside of the package structure through a solder ball or a bump. The materials of the hole conducting layers 106a' and 106b' may include metal materials, conducting polymer materials, conducting ceramic materials, or combinations thereof. The conducting layers 106a' and 106b' may be formed by a physical vapor deposition, chemical vapor deposition, or electrochemical plating. A photolithography and etching process may be performed to pattern the conducting layers to a desired pattern. In this embodiment, the conducting layers 106a' and 106b' are preferably formed simultaneously. That is, the conducting layers 106a' and 106b' are preferably formed from patterning a same conducting layer.

Still referring to FIG. 1B, filling layers 108a' and 108b' are optionally formed overlying the hole conducting layers 106a' and 106b' in the holes 102a' and 102b', respectively. The materials of the filling layers 108a' and 108b' may include polymer materials, such as a solder resist, polyimide, polyimide-like material, or combinations thereof. The filling layers 108a' and 108b' may be formed by, for example, an electroplating, spin coating, spray coating, curtain coating process, or combinations thereof.

Figure 1C:
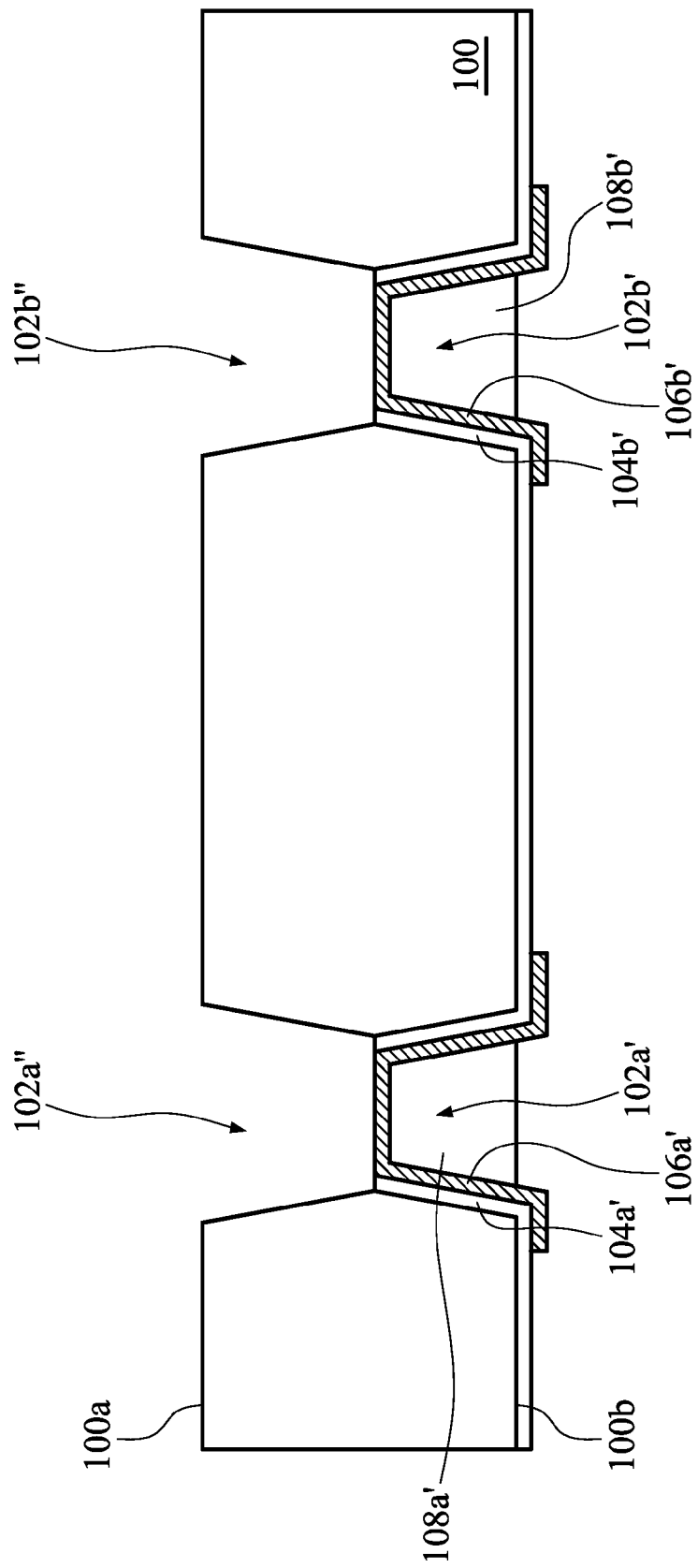

Then, as shown in FIG. 1C, holes 102a" and 102b" are formed from the upper surface 100a of the substrate 100 by, for example, an etching process or a laser drilling process. The holes 102a" and 102b" substantially align with the underlying holes 102a' and 102b', respectively. In one embodiment, the holes 102a" and 102b" are formed by an etching process, wherein the hole conducting layers 106a' and 106b' are used as etching stop layers during the forming of the holes 102a" and 102b". Bottom portions of the holes 102a" and 102b" expose the hole conducting layers 106a' and 106b', respectively. In one embodiment, during the forming of the holes 102a" and 102b", the insulating layers 104a' and 104b' on the bottom portions of the holes 102a' and 102b' are also removed, respectively.

Figure 1D:
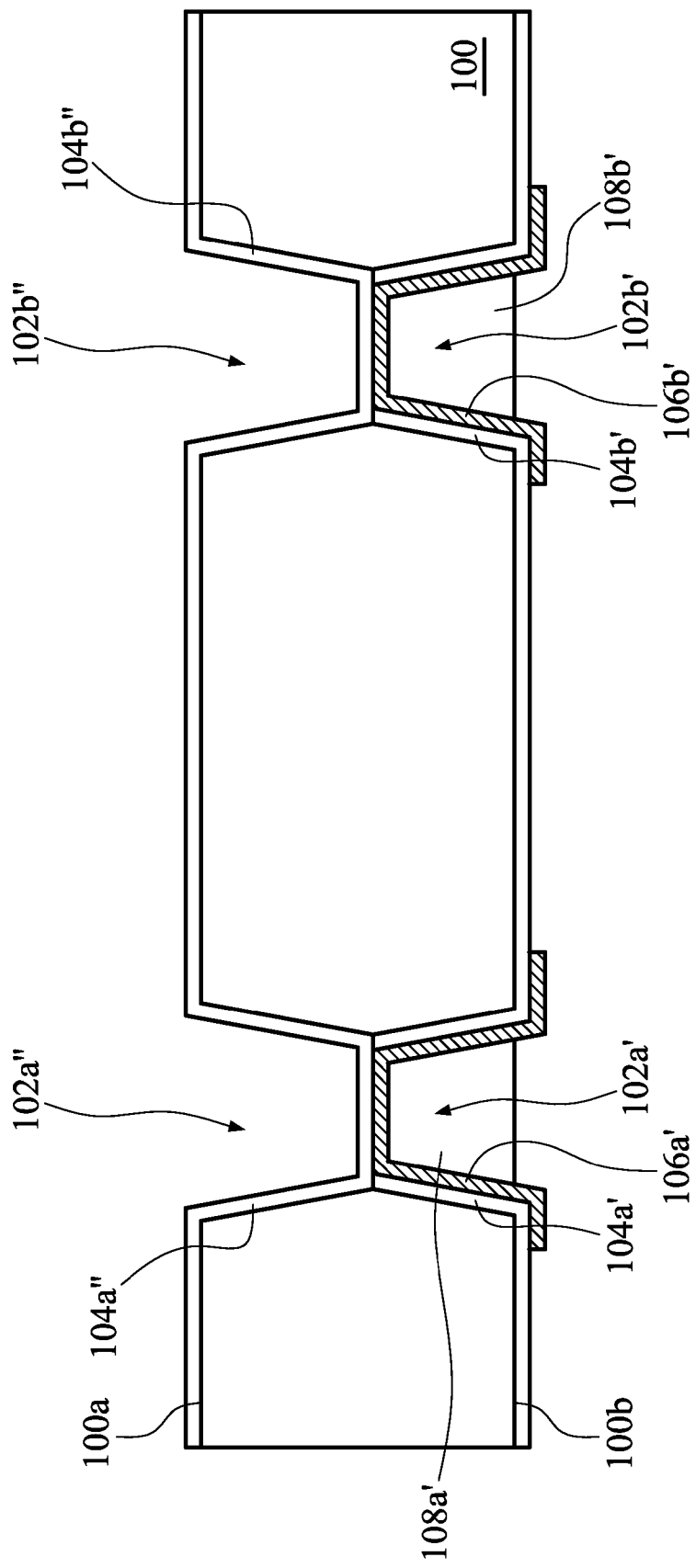

As shown in FIG. 1D, insulating layers 104a" and 104b" are then optionally formed overlying sidewalls and bottom portions of the holes 102a" and 1902b", respectively. The insulating layers 104a" and 104b" are further extended over the upper surface 100a of the carrier substrate 100. In one embodiment, the material and fabrication method of the insulating layers 104a" and 104b" may be the same as or similar to those of the insulating layers 104a' and 104b'.

Figure 1E:
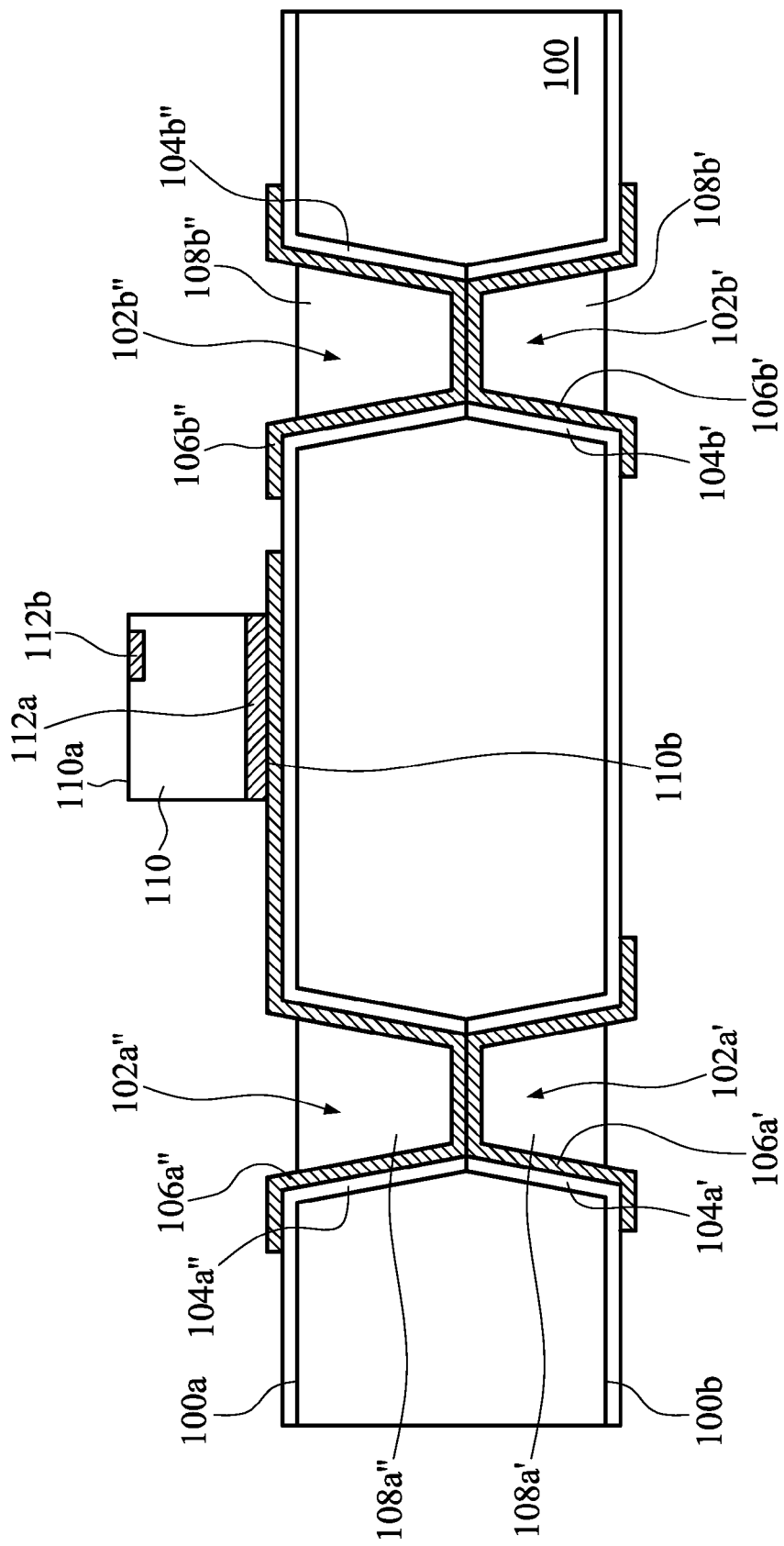

As shown in FIG. 1E, by using, for example, a photolithography and etching process or laser ablating process, the insulating layers 104a" and 104b" on the bottom portions of the holes 102a" and 102b" are removed, respectively. Then, hole conducting layers 106a" and 106b" are formed overlying the sidewalls and the bottom portions of the holes 102a" and 102b", respectively. The hole conducting layers 106a" and 106b" are further extended over the upper surface 100a of the carrier substrate 100. In one embodiment, the material and fabrication method of the hole conducting layers 106a" and 106b" may be the same as or similar to those of the conducting layers 106a' and 106b'. Then, filling layers 108a" and 108b" are optionally formed overlying the hole conducting layers 106a" and 106b" in the holes 102a" and 102b", respectively. In one embodiment, the material and fabrication method of the filling layers 108a" and 108b" may be the same as or similar to those of the filling layer 108a' and 108b'.

In this embodiment, although the stacked through-hole is formed by first forming a lower hole, followed by forming an upper hole, embodiments of the invention are not limited thereto. In another embodiment, the upper hole is formed first, followed by forming the lower hole. In one embodiment, for the holes together forming the stacked through-hole, a bottom size of a hole formed later is preferable less than that of a hole formed previously. The alignment between the holes may be improved.

In this embodiment, the stacked holes 102a' and 102a" and the hole conducting layers 106a' and 106a" overlying the sidewalls of the holes 102a' and 102a" form a first conducting path (a first through-substrate via). Similarly, the stacked holes 102b' and 102b" and the hole conducting layers 106b' and 106b" overlying the sidewalls of the holes 102b' and 102b" form a second conducting path (a second through-substrate via). In addition, in the embodiment shown in FIG. 1E, it is preferable that the insulating layers 104a', 104a", 104b', and 104b" are formed between the carrier substrate 100 and the first conducting path (first through-substrate via) and the second conducting path (second through-substrate via). Depending on requirement, the filling layers 108a', 108a", 108b', and 108b" may be optionally filled on the hole conducting layers of the first conducting path and the second conducting path, respectively.

The embodiment of the invention includes many variations. For example, the hole conducting layer may substantially fill the hole completely. Between two stacked holes, such as a horizontal interface between the holes, a middle conducting layer may be used to electrically connect the hole conducting layers in the upper hole and the lower hole, respectively, depending on requirement and process situation.

In this embodiment, although the through-substrate via is formed by first forming a lower hole and a lower hole conducting layer, followed by forming an upper hole and an upper hole conducting layer, embodiments of the invention are not limited thereto. In another embodiment, the upper hole and the upper hole conducting layer are formed first, followed by forming the lower hole and the lower hole conducting layer. Further, when the upper hole is formed, a cavity used for support a chip is preferably formed simultaneously.

In an embodiment of using a wafer as a carrier substrate, a dicing process may first be performed to form a plurality of carrier substrates for packaging. These carrier substrates may be disposed on a plate. The light emitting chips are then disposed on the carrier substrates and the following packaging processes are performed.

Still referring to FIG. 1E, a chip 110 is disposed overlying the carrier substrate 100. For example, an adhesion layer (not shown) may be used to fix the chip 110 overlying the carrier substrate 100. The chip 110 has a first surface 110a and an opposite second surface 110b. The chip 110 includes a plurality of electrodes, such as a first electrode 112a and a second electrode 112b. The first electrode 112a and the second electrode 112b may be both disposed on the first surface 110a, both disposed on the second surface 110b, or separately disposed on the first surface 110a and the second surface 110b. In the embodiment shown in FIG. 1E, the electrode 112a and the electrode 112b are separately disposed on the second surface 110b and the first surface 110a, respectively. Typically, the bottom electrode 112a may be, but is not limited to, over the entire second surface 112b of the chip 110. As shown in FIG. 1E, the electrode 112a electrically connects the hole conducting layer 106a" extending over the upper surface 100a of the carrier substrate 100, wherein the hole conducting layer 106a" extending over the upper surface 100a is used as a redistribution layer providing the conducting route between the electrode 112a and the conducting layer in the through-hole including the hole conducting layers 106a" and 106a'.

The chip 110 may include other electronic devices, such as (but is not limited to) micro electro mechanical systems (MEMS), micro fluidic systems, physical sensors for detecting physical changes such as detecting heat, light, or pressure, RF devices, accelerators, gyroscopes, micro actuators, surface acoustic wave devices, pressure sensors, ink printer heads, light emitting devices, or solar cells. In this embodiment, the chip 110 is, for example, a light emitting diode chip, wherein the first electrode 112a has a conductivity opposite to that of the second electrode 112b. In one embodiment, the first electrode 112a is a p-type electrode and the second electrode 112b is an n-type electrode. In another embodiment, the first electrode 112a is an n-type electrode and the second electrode 112b is a p-type electrode.

Figure 1F:
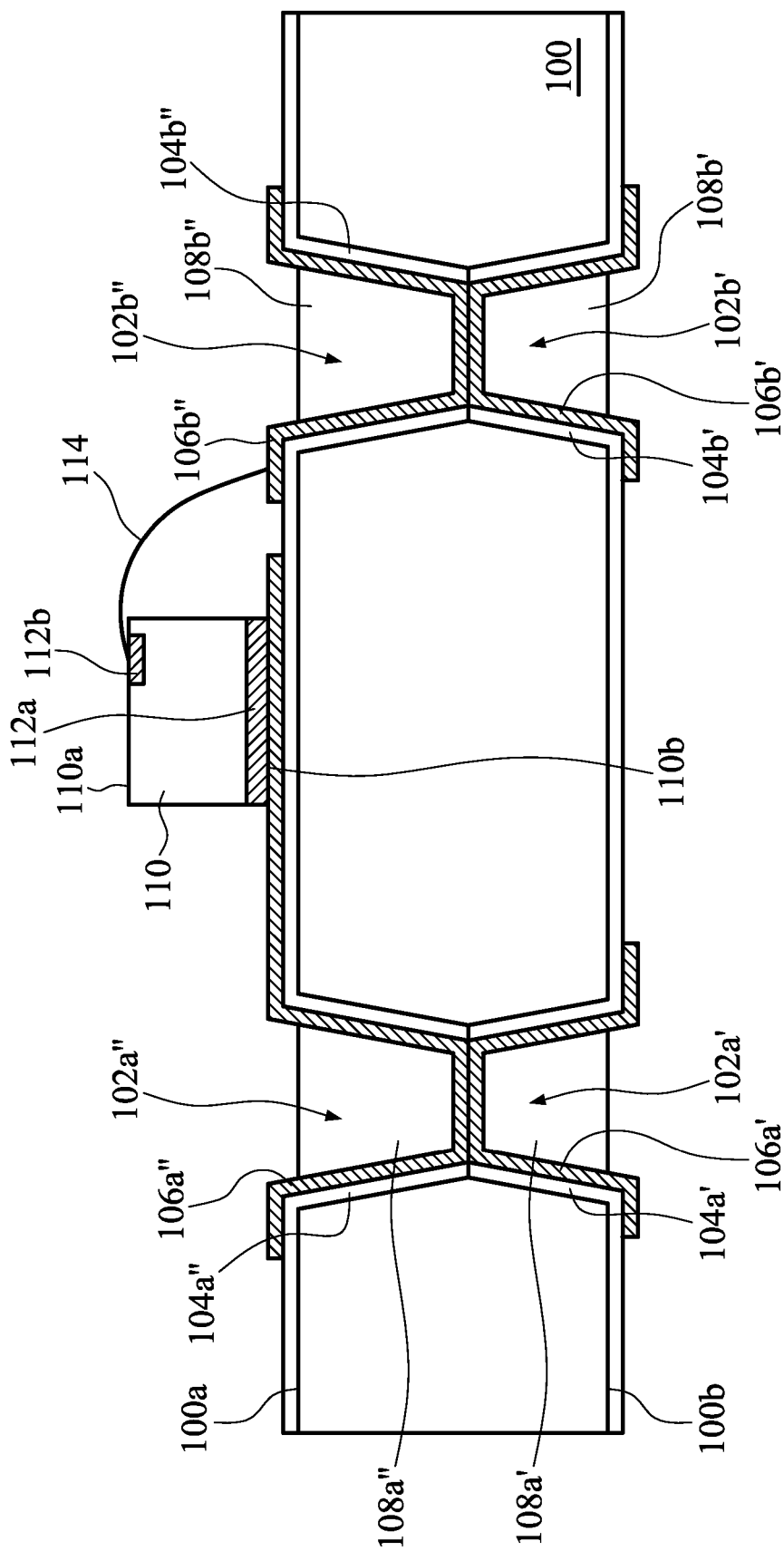

As shown in FIG. 1F, in one embodiment, a wire bonding process may be performed to form a bonding wire 114 between the second electrode 112b and the hole conducting layer 106b". Through the bonding wire 114 and the conducting layer comprising the conducting layers 106b' and 106b" and penetrating the carrier substrate 100, the conducting route electrically connecting the second electrode 112b may conduct to the lower surface 100b of the carrier substrate 100. In another embodiment, the second electrode 112b and the conducting layer 106b" are not limited to be electrically connected together by a bonding wire. A redistribution layer may be used instead. Similarly, the first electrode 112a and the conducting layer 106a" are not limited to be electrically connected together by a redistribution layer, but a bonding wire may be used instead.

In the embodiment shown in FIG. 1F, the package structure for chip includes a carrier substrate 100. The carrier substrate 100 has an upper surface 100a and a lower surface 100b. A chip 110 is disposed overlying the upper surface 100a. The chip 110 has a first surface 110a and an opposite second surface 110b, wherein the first surface 110a faces the upper surface 100a. The chip 110 further includes a plurality of electrodes, such as a first electrode 112a and a second electrode 112b. In this embodiment, the first electrode 112a and the second electrode 112b are separately disposed on the second surface 110b and the first surface 110a, respectively. The package structure for chip further includes a first conducting structure, disposed on the carrier substrate 100 and electrically connected to the first electrode 112a, and a second conducting structure disposed on the carrier substrate 100 and electrically connected to the second electrode 112b. In this embodiment, the first conducting structure is a hole conducting layer 106a" extending over the upper surface 100a of the carrier substrate 100 and the second conducting structure is a bonding wire 114. The package structure for chip further includes a through-hole penetrating the upper surface 100a and the lower surface 100b of the carrier substrate 100 and located next to the chip 110 without overlapping the chip 110. In this embodiment, the through-hole is a stacked through-hole composed of a lower hole 102a' and an upper hole 102a". A conducting layer formed overlying a sidewall of the through-hole comprises a lower hole conducting layer 106a' and an upper hole conducting layer 106a". The conducting layer electrically connects the redistribution layer used as the first conducting structure, wherein the redistribution layer is the hole conducting layer 106a" extending over the upper surface 100a of the carrier substrate 100. The second conducting structure (the bonding wire 114) electrically connecting the second electrode 112b further electrically connects a third conducting structure disposed on the carrier substrate. In this embodiment, the third conducting structure also includes a stacked via. The stacked via of the third conducting structure includes a stacked hole including holes 102b' and 102b" and a conducting layer, including hole conducting layers 106b' and 106b", overlying a sidewall of the through-hole. In addition, the embodiment shown in FIG. 9F preferably includes an insulating layer between the conducting route and the carrier substrate 900. The insulating layers may include insulating layers 104a', 104a", 104b', and 104b". Filling layers 108a', 108a", 108b', and 108b" may be optionally formed overlying the conducting layer in the through-hole. In this embodiment, the through-hole includes a middle conducting layer penetrating the filling layer. The middle conducting layer is composed of the hole conducting layer 106a" on the bottom portion of the hole 102a" and the hole conducting layer 106a' on the bottom portion of the hole 102a'.

Embodiments of the invention may have many other variations. For example, the conducting layer in the through-hole may be substantially filled the through-hole. The conducting route between the conducting electrode and the conducting layer in the through-hole or the third conducting structure may be formed by a bonding wire or a redistribution layer. Depending upon requirements, the third conducting structure may be a bonding wire or a via. The via may be a stacked via formed stepwise or a single via depending upon application and process requirements.

The package structure for chip of the embodiment of the invention not only includes disposing the chip over the carrier substrate, but also includes disposing the chip in a cavity of the carrier substrate. FIGS. 2A-2E show cross-sectional views for illustrating the steps for forming a package structure for chip in accordance with an embodiment of the present invention.

Figure 2A:
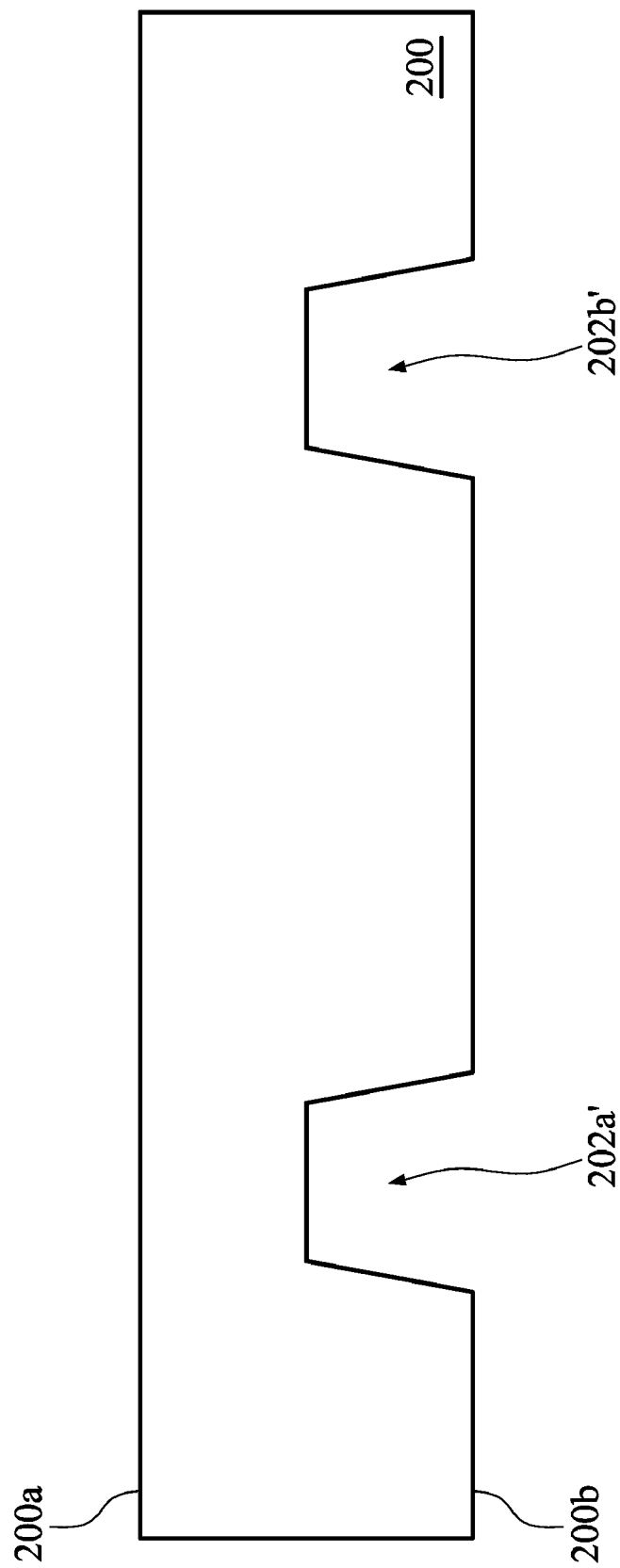
FIGS. 2A-2E are cross-sectional views showing the steps for forming a package structure for chip in accordance with an embodiment of the present invention.

First, as shown in FIG. 2A, a carrier substrate 200 having an upper surface 200a and an opposite lower surface 200b is provided. The material of the carrier substrate 200 may be similar to that of the carrier substrate 100 described in the embodiment shown in FIGS. 1A-1F.

Next, still referring to FIG. 2A, holes 202a' and 202b' penetrating through the carrier substrate 200 are formed from the lower surface 200b to a predetermined depth. Bottom portions of the holes 202a' and 202b' expose the carrier substrate 200. The hole 202a' and 202b' may be located next to the chip. The forming of the holes 202a' and 202b' may be similar to that of the holes 102a' and 102b' described in the embodiment shown in FIG. 1A. Forming through-holes stepwise instead of forming through-holes in a single process may improve aspect ratio, reduce process time and process difficulty, and increase product yield.

Figure 2B:
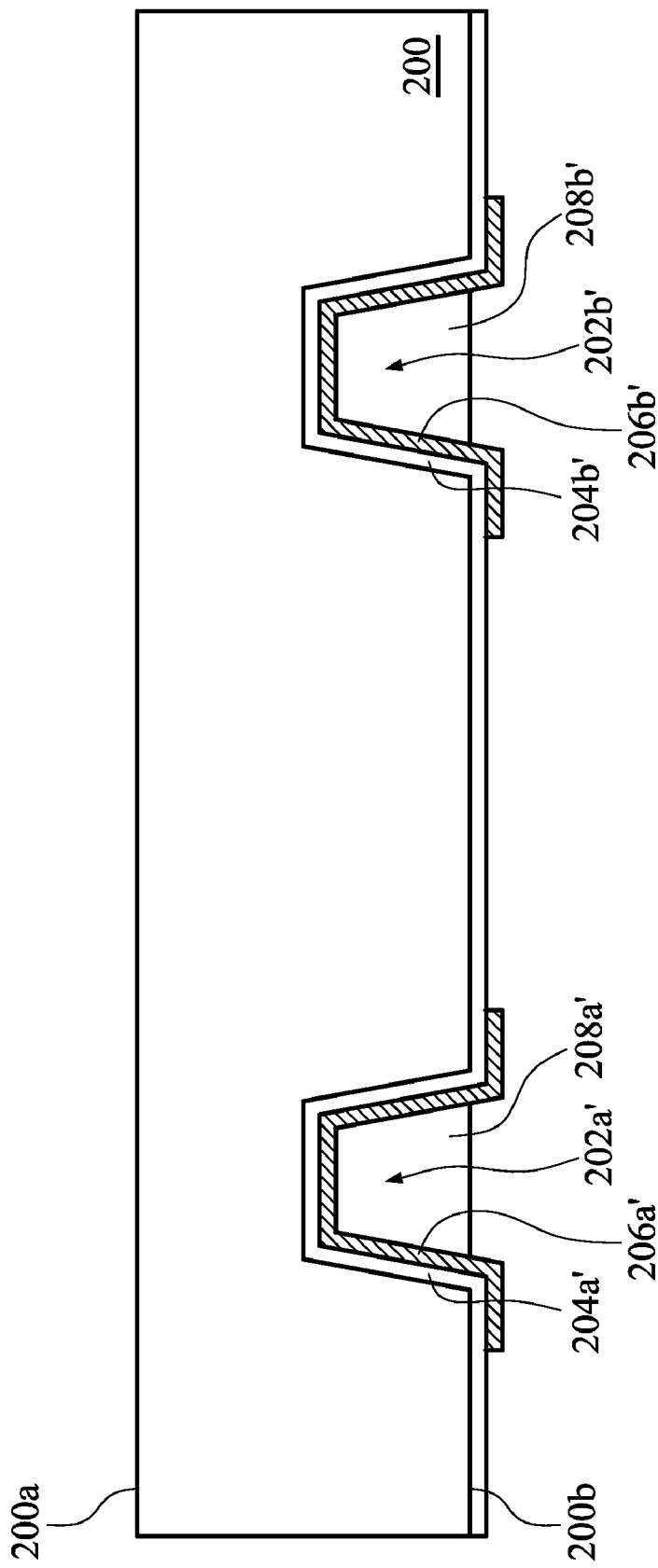

Referring to FIG. 2B, insulating layers 204a' and 204b' are optionally formed overlying sidewalls of the holes 202a' and 202b' and portions of the carrier substrate 200, respectively. The material and fabrication method of the insulating layers 204a' and 204b' may be the same as or similar to those of the insulating layers 104a' and 104b' described in the embodiment shown in FIG. 1B.

Still referring to FIG. 2B, hole conducting layers 206a' and 206b' are then formed overlying the sidewalls of the holes 202a' and 202b', respectively. The hole conducting layers 206a' and 206b' are further extended over the lower surface 200b of the carrier substrate 200, which may be used as a conducting route between the package structure for chip and other electrical elements outside of the package structure. For example, the hole conducting layers 206a' and 206b' extending over the lower surface 200b may further electrically connect other electrical elements, for example a printed circuit board, outside of the package structure through a solder ball or a bump. The material and fabrication method of the hole conducting layers 206a' and 206b' may be the same as or similar to those of the conducting layers 106a' and 106b' described in the embodiment shown in FIG. 1B.

Still referring to FIG. 2B, filling layers 208a' and 208b' are optionally formed overlying the hole conducting layers 206a' and 206b' in the holes 202a' and 202b', respectively. The material and fabrication method of the filling layers 208a' and 208b' may be the same as or similar to those of the filling layers 108a' and 108b' described in the embodiment shown in FIG. 1B.

Figure 2C:
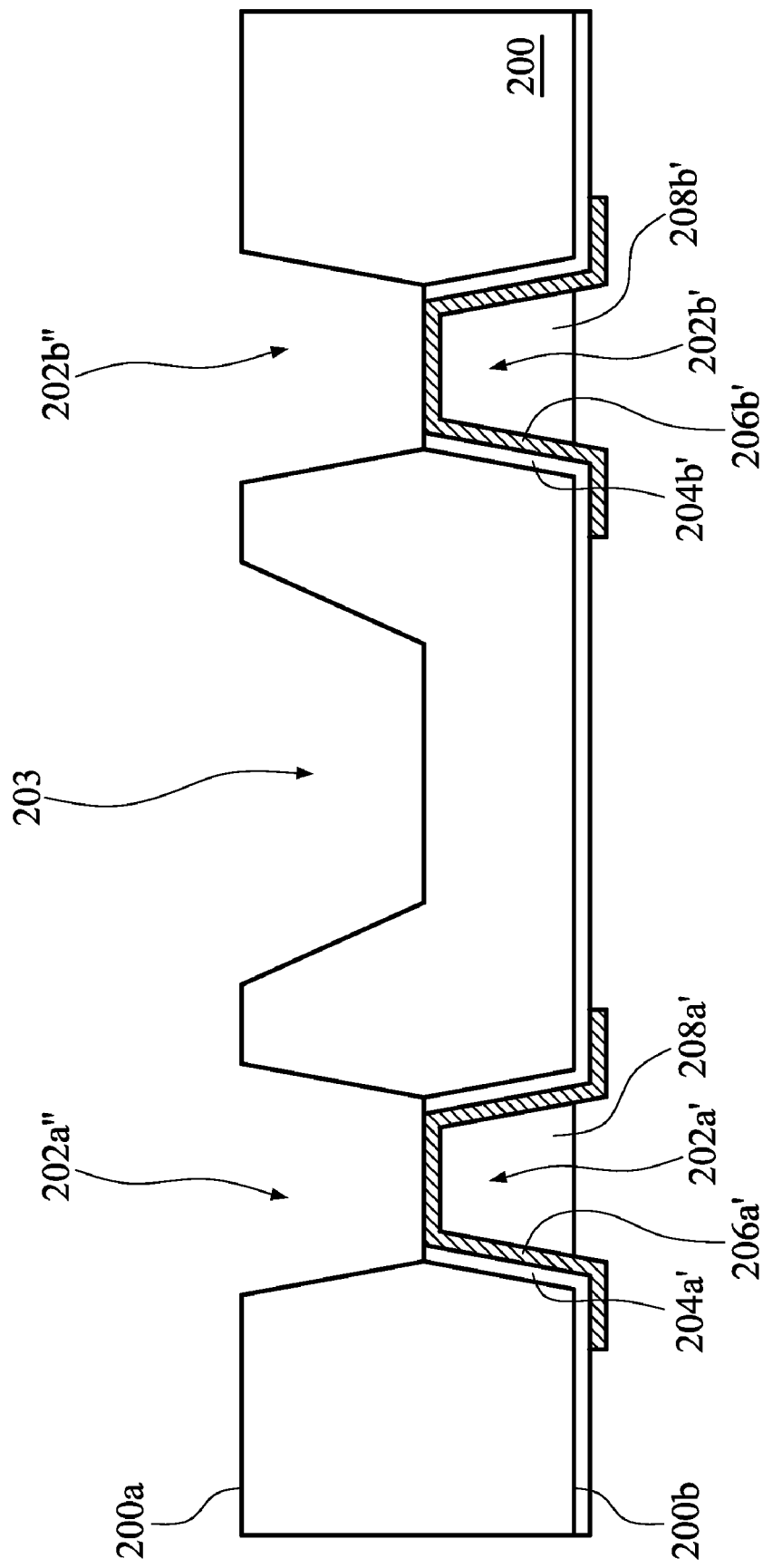

Then, as shown in FIG. 2C, holes 202a" and 202b" are formed from the upper surface 200a of the substrate 200 by, for example, an etching process or a laser drilling process. The holes 202a" and 202b" substantially align with the underlying holes 202a' and 202b', respectively. Bottom portions of the holes 202a" and 202b" expose the hole conducting layers 206a' and 206b', respectively. In one embodiment, the holes 202a" and 202b" are formed by an etching process, wherein the hole conducting layers 206a' and 206b' on the bottom portions of the holes 202a' and 202b' may be used as etch stop layers for forming the holes 202a" and 202b", respectively. In one embodiment, during the forming of the holes 202a" and 202b", the insulating layers 204a' and 204b' on the bottom portions of the holes 202a' and 202b' are also removed, respectively.

Still referring to FIG. 2C, a cavity 203 is formed from the upper surface 200a of the carrier substrate 200. A bottom portion of the cavity 203 is used to dispose a chip thereon. The forming of the cavity 203 may be similar to that of the holes 202a" and 202b". In one embodiment, the cavity 203 is preferably formed simultaneously with the forming of the holes 202a" and 202b", thus reducing additional fabrication processes. In one embodiment, a depth of the cavity 203 may be substantially equal to that of the hole 202a" or 202b". In another embodiment, the depth of the cavity 203 is deeper than that of the hole 202a" or 202b". In addition, in another embodiment, if the chip disposed in the cavity is a light emitting diode chip, a reflective layer may further be formed overlying the sidewall and/or the bottom portion of the cavity to increase the brightness of the emitted light.

Figure 2D:
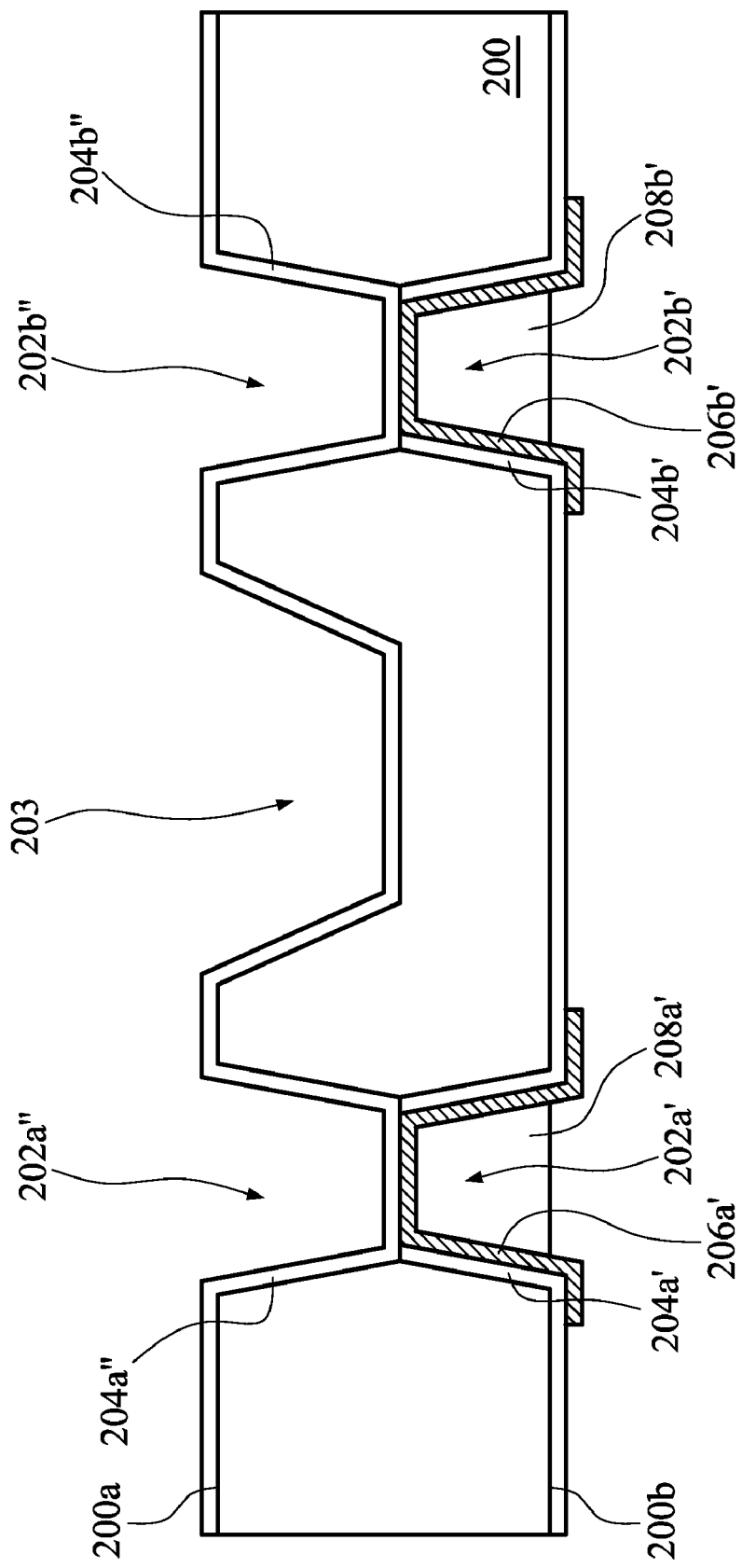

As shown in FIG. 2D, insulating layers 204a" and 204b" are then optionally formed overlying sidewalls and bottom portions of the holes 202a" and 202b", respectively. The insulating layers 204a" and 204b" are further extended over the upper surface 200a of the carrier substrate 200 and extended over the sidewall and the bottom portion of the cavity 203. The material and fabrication method of the insulating layers 204a" and 204b" may be the same as or similar to those of the insulating layers 204a' and 204b'.

Figure 2E:
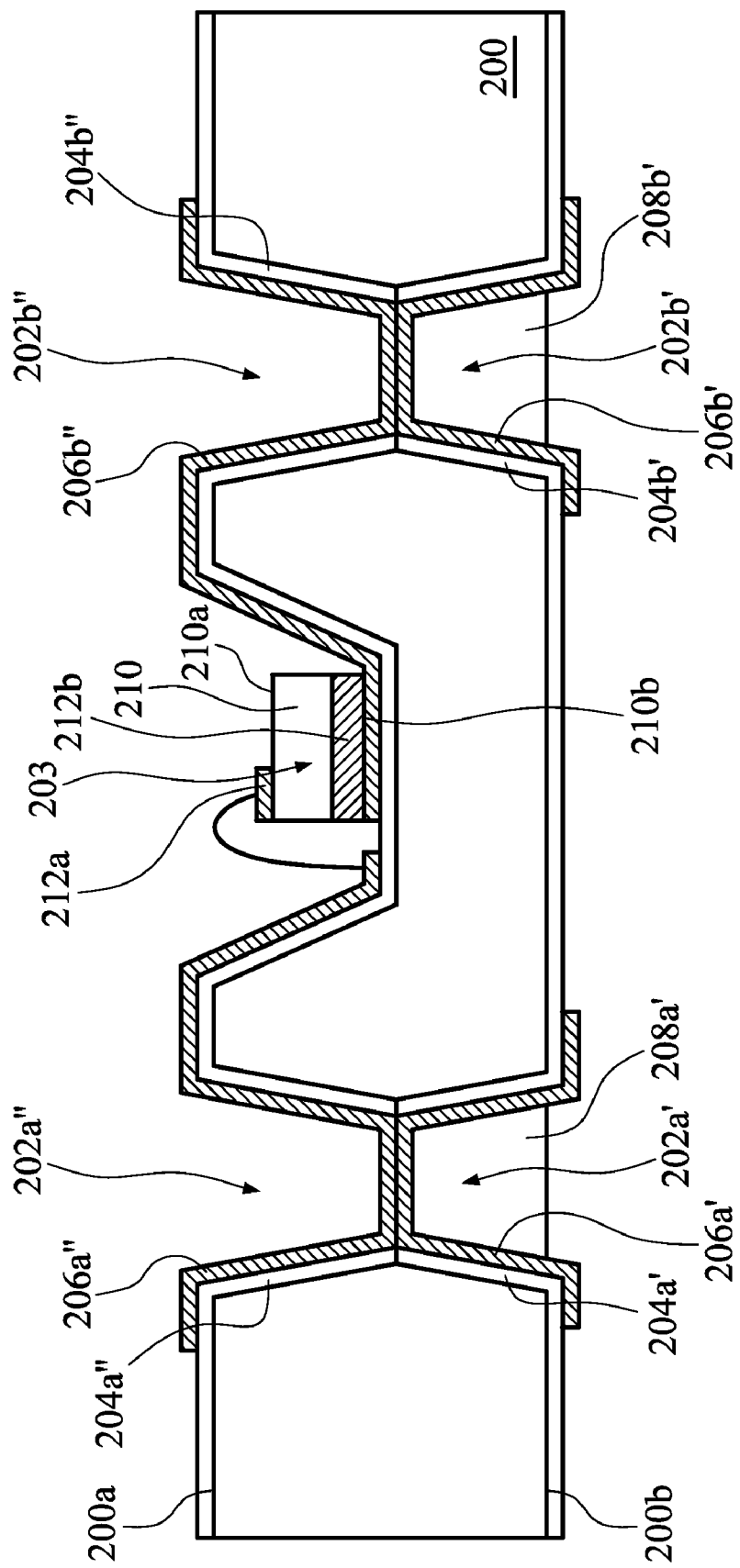

As shown in FIG. 2E, by using, for example, a photolithography and etching process or laser ablating process, the insulating layers 204a" and 204b" on the bottom portions of the holes 202a" and 202b" are removed, respectively. Then, the hole conducting layers 206a" and 206b" are formed overlying the sidewalls and the bottom portions of the holes 202a" and 202b", respectively. The hole conducting layers 206a" and 206b" are further extended over the upper surface 200a of the carrier substrate 200. In one embodiment, the chip to be disposed overlying the bottom portion of the cavity 203 is a light emitting diode chip. In this case, it is preferable to form a reflective layer overlying the sidewall and the bottom portion of the cavity 203. In one embodiment, the reflective layer is preferably formed simultaneously with the forming of the hole conducting layers 206a" and 206b". The material and fabrication method of the hole conducting layers 206a" and 206b" may be similar to those of the conducting layers 206a' and 206b'. The material of the reflective layer includes metal material having reflectivity. The forming of the reflective layer may be the same as or similar to that of the hole conducting layers 206a" and 206b". In this embodiment, the hole conducting layers 206a" and 206b" extending overlying the sidewall of the cavity 203 are used as the reflective layer.

Still referring to FIG. 2E, a chip 210 is disposed overlying the carrier substrate 200. In this embodiment, the chip 210 is disposed on the bottom portion of the cavity 203. For example, an adhesion layer (not shown) may be used to fix the chip 210 overlying the carrier substrate 200. The chip 210 has a first surface 210a and an opposite second surface 210b. The chip 210 includes a first electrode 212a and a second electrode 212b. The first electrode 212a and the second electrode 212b may be both disposed on the first surface 210a, both disposed on the second surface 210b, or separately disposed on the first surface 210a and the second surface 210b. In the embodiment shown in FIG. 2E, the first electrode 212a and the second electrode 212b are both disposed on the first surface 210a.

The chip 210 may be similar to the chip 110 described in the embodiment shown in FIGS. 1A-1F. In this embodiment, the chip 210 is, for example, a light emitting diode chip, wherein the first electrode 212a has a conductivity opposite to that of the second electrode 212b. In one embodiment, the first electrode 212a is a p-type electrode and the second electrode 212b is an n-type electrode. In another embodiment, the first electrode 212a is an n-type electrode and the second electrode 212b is a p-type electrode.

In this embodiment, although the stacked via is formed by first forming the lower hole and the lower hole conducting layer, followed by forming the upper hole and the upper hole conducting layer, embodiments of the invention are not limited thereto. In another embodiment, an upper hole and an upper hole conducting layer may be formed first, followed by forming a lower hole and a lower hole conducting layer.

Moreover, it is preferable to form the cavity used for disposing the chip simultaneously with the forming of the upper hole.

In the embodiments discussed above, when the third conducting structure is a stacked via, the third conducting structure is next to the chip. However, embodiments of the invention are not limited thereto. FIGS. 3A-3E show cross-sectional views for illustrating the steps for forming a package structure for chip in accordance with an embodiment of the present invention.

Figure 3A:
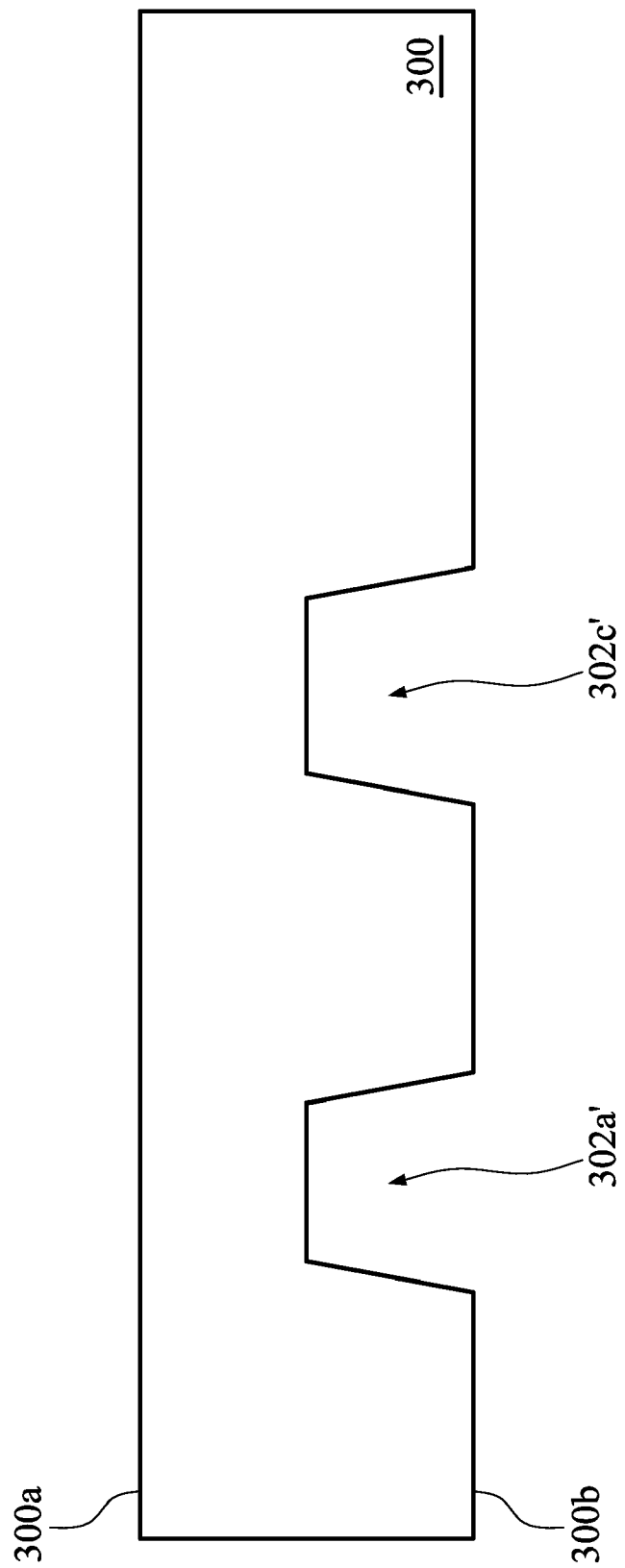
FIGS. 3A-3E are cross-sectional views showing the steps for forming a package structure for chip in accordance with an embodiment of the present invention.

First, as shown in FIG. 3A, a carrier substrate 300 having an upper surface 300a and an opposite lower surface 300b is provided. The material of the carrier substrate 300 may be the same as or similar to that of the carrier substrate 100 described in the embodiment shown in FIGS. 1A-1F.

Next, still referring to FIG. 3A, holes 302a' and 302c' penetrating through the carrier substrate 300 are formed from the lower surface 300b to a predetermined depth. Bottom portions of the holes 302a' and 302c' expose the carrier substrate 300. The hole 302a' may be located next to the chip. In this embodiment, the hole 302c' may be disposed underlying the to be disposed chip. The forming of the holes 302a' and 302c' may be the same as or similar to that of the holes 202a' and 202b' described in the embodiment shown in FIG. 2A. Forming through-holes stepwise instead of forming through-holes in a single process may improve aspect ratio, reduce process time and process difficulty, and increase product yield.

Figure 3B:
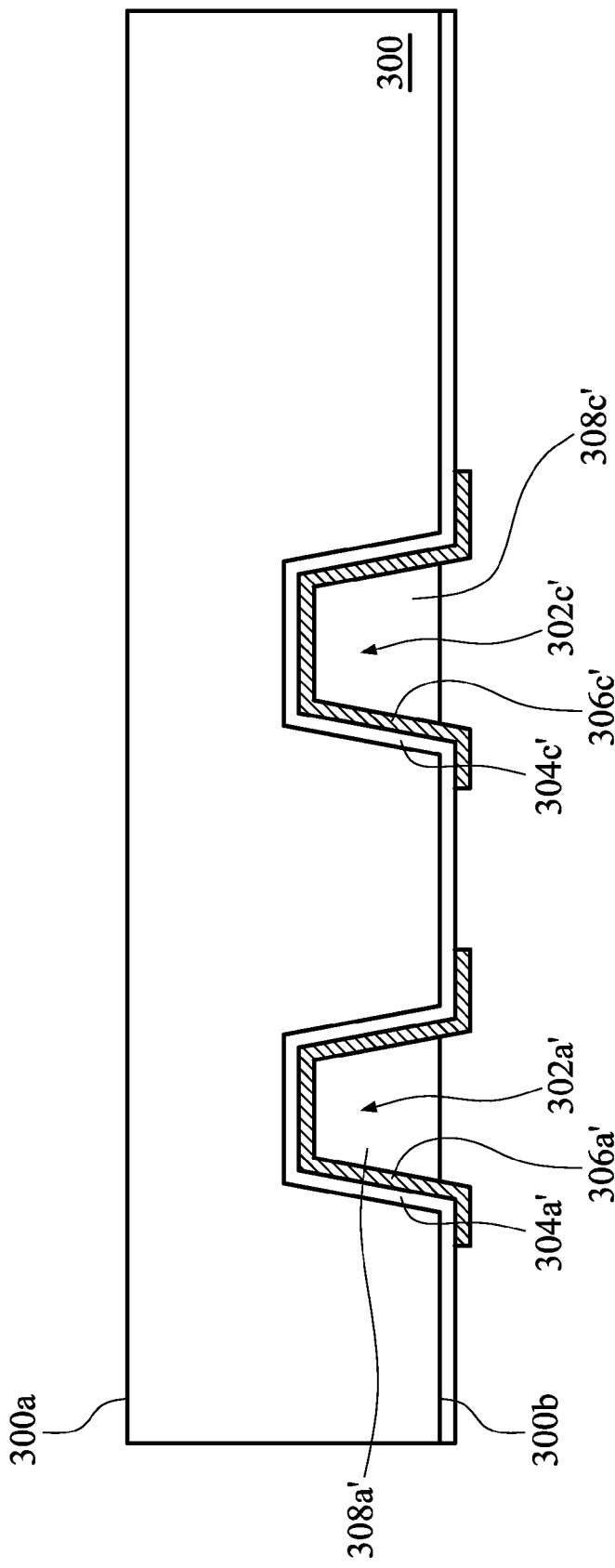

Referring to FIG. 3B, insulating layers 304a' and 304c' are optionally formed overlying sidewalls of the holes 302a' and 302c' and portions of the carrier substrate 300, respectively. The material and fabrication method of the insulating layers 304a' and 304c' may be the same as or similar to those of the insulating layers 204a' and 204b' described in the embodiment shown in FIG. 2B.

Still referring to FIG. 3B, hole conducting layers 306a' and 306c' are then formed overlying the sidewalls of the holes 302a' and 302c', respectively. The hole conducting layers 306a' and 306c' are further extended over the lower surface 300b of the carrier substrate 300, which may be used as a conducting route between the package structure for chip and other electrical elements outside of the package structure. For example, the hole conducting layers 306a' and 306c' extending over the lower surface 300b may further electrically connect other electrical elements, for example a printed circuit board, outside of the package structure through a solder ball or a bump. The material and fabrication method of the hole conducting layers 306a' and 306c' may be the same as or similar to those of the conducting layers 206a' and 206b' described in the embodiment shown in FIG. 2B.

Still referring to FIG. 13B, filling layers 308a' and 308c' are optionally formed overlying the hole conducting layers 306a' and 306c' in the holes 302a' and 302c', respectively. The material and fabrication method of the filling layers 308a' and 308c' may be the same as or similar to that of the filling layer 208a' and 208b' described in the embodiment shown in FIG. 2B.

Figure 3C:
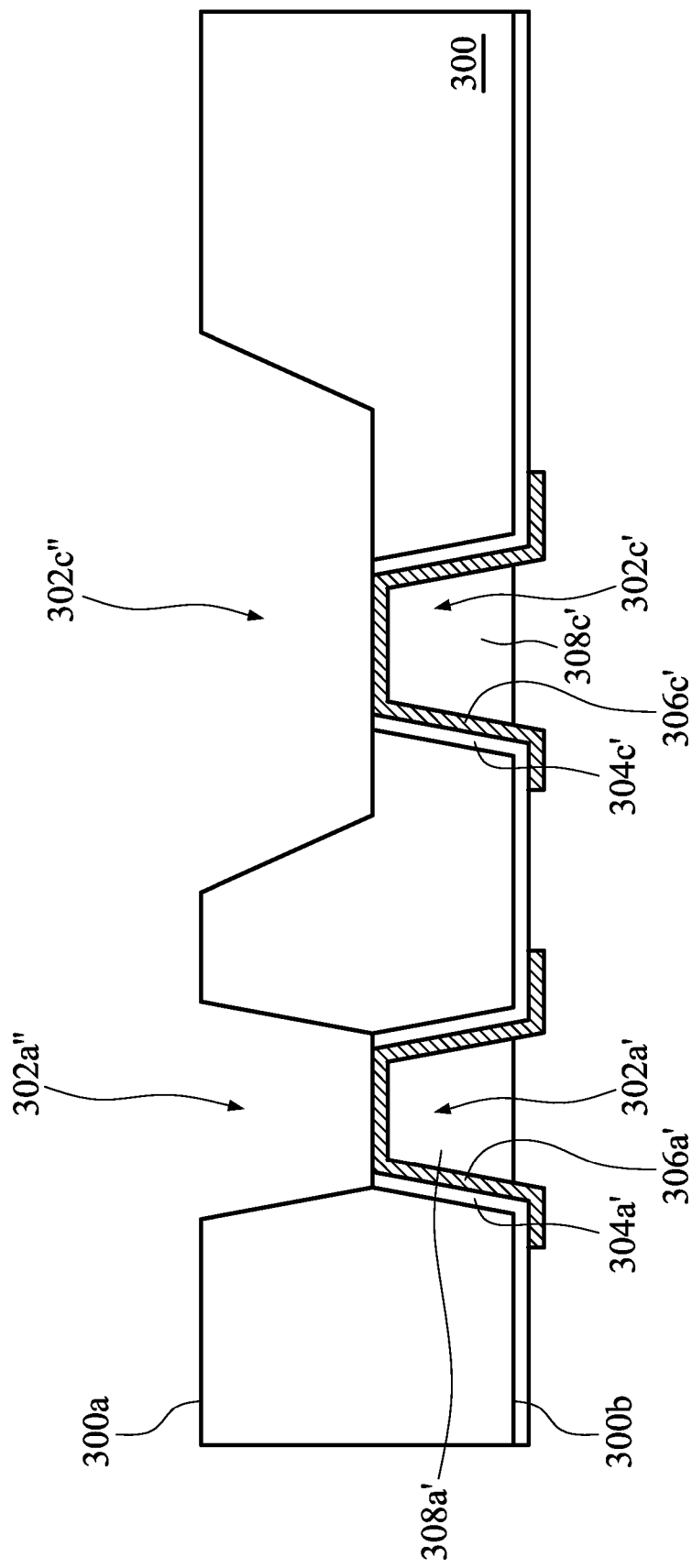

Then, as shown in FIG. 3C, a hole 302a" and a cavity 302c" are formed from the upper surface 300a of the substrate 300 by, for example, an etching process or a laser drilling process. The hole 302a" and the cavity 302c" substantially align with the underlying holes 302a' and 302c', respectively. In one embodiment, the opening of the cavity 302c" has a diameter larger than that of the hole 302c'. Bottom portions of the hole 302a" and the cavity 302c" expose the hole conducting layers 306a' and 306c', respectively. In one embodiment, the hole 302a" and the cavity 302c" are formed by an etching process, wherein the hole conducting layers 306a' and 306c' on the bottom portions of the holes 302a' and 302c' may be used as etch stop layers for forming the hole 302a" and the cavity 302c", respectively. In one embodiment, during the forming of the hole 302a" and the cavity 302c", the insulating layers 304a' and 304c' on the bottom portions of the holes 302a' and 302c' are also removed, respectively.

In one embodiment, if the chip disposed in the cavity is a light emitting diode chip, a reflective layer may further be formed overlying the sidewall and/or the bottom portion of the cavity to increase brightness of the emitted light.

Figure 3D:
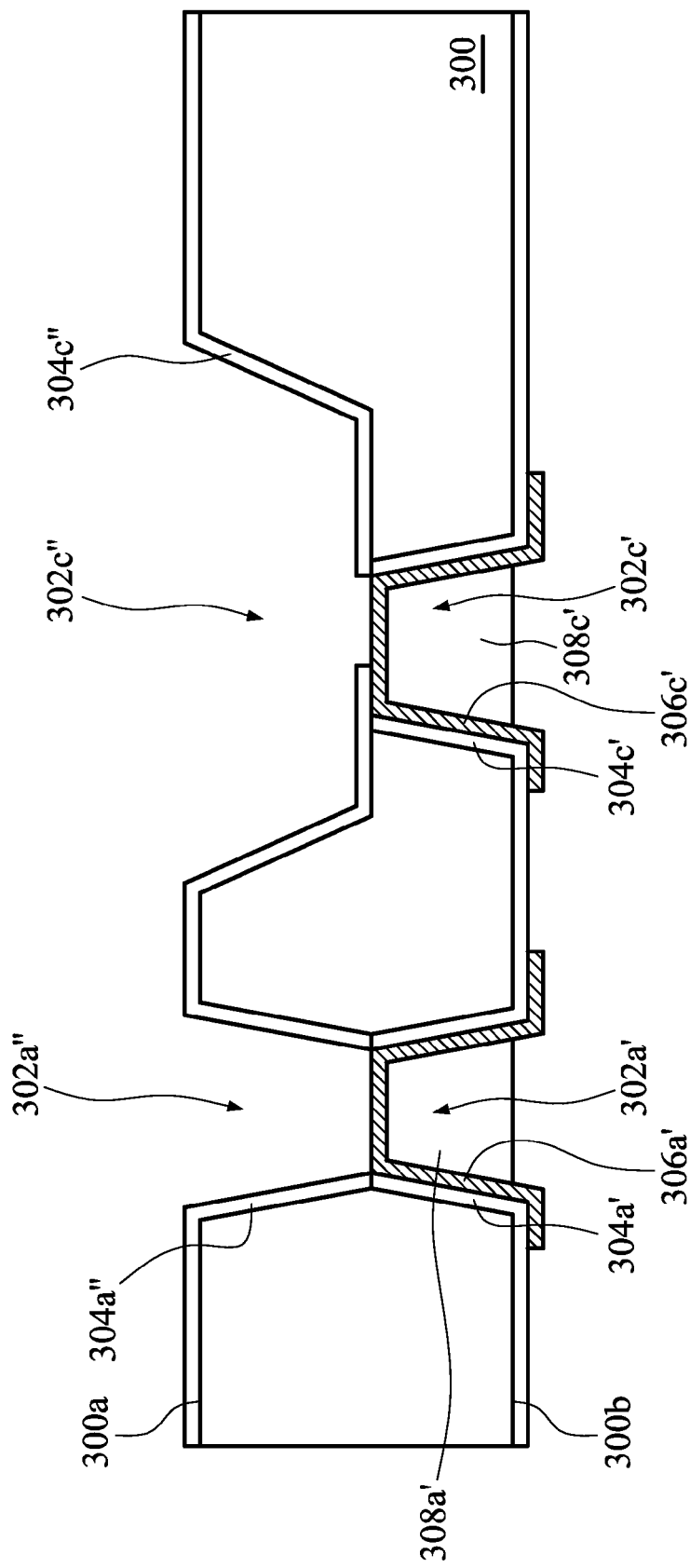

As shown in FIG. 3D, insulating layers 304a" and 304c" are then optionally formed overlying sidewalls and bottom portions of the hole 302a" and the cavity 302c", respectively. The insulating layers 304a" and 304c" are further extended over the upper surface 300a of the carrier substrate 300. The material and fabrication method of the insulating layers 304a" and 304c" may be similar to those of the insulating layers 304a' and 304c'. In this embodiment, the insulating layers 304a" and 304c" are formed by patterning a same insulating layer. For example, by using a photolithography and etching process or laser ablating process, the insulating layers 304a" and 304c" on the bottom portions of the hole 302a" and the cavity 302c" are removed, respectively.

Figure 3E:
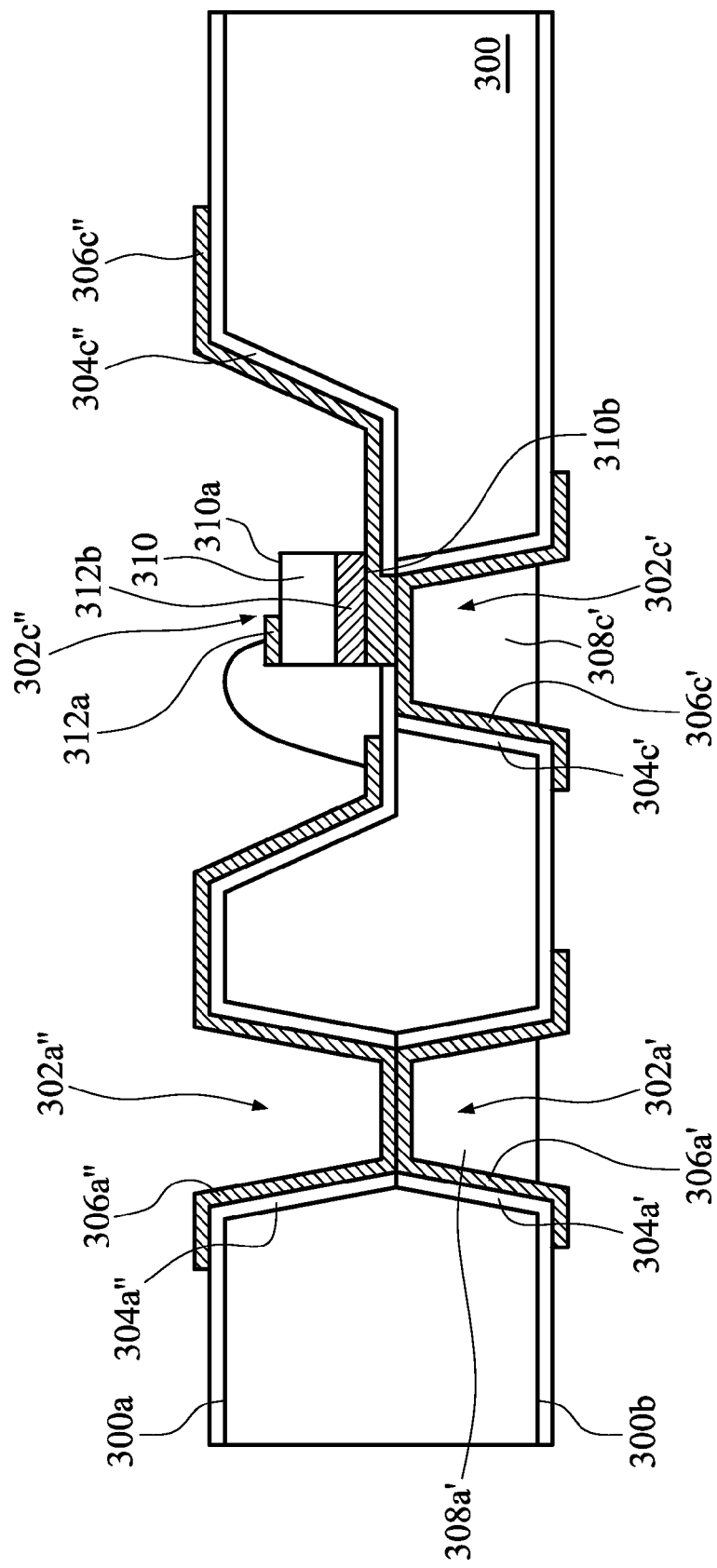

Then, as shown in FIG. 3E, hole conducting layers 306a" and 306c" are formed overlying the sidewalls and the bottom portions of the hole 302a" and the cavity 302c", respectively. The hole conducting layers 306a" and 306c" are further extended over the upper surface 300a of the carrier substrate 300. If the chip to be packaged is a light emitting diode chip, the hole conducting layers 306a" and 306c" extending over the sidewall and the bottom portion of the cavity 302c" may be used as a reflective layer and provide the conducting route between the chip and other electrical elements outside of the package structure.

Still referring to FIG. 3E, a chip 310 is disposed overlying the carrier substrate 300. For example, an adhesion layer (not shown) may be used to fix the chip 310 overlying the carrier substrate 300. In this embodiment, the disposition of the chip 310 overlaps the through-hole comprising the hole 302c' and the cavity 302c". The chip 310 has a first surface 310a and an opposite second surface 310b. The chip 310 includes a first electrode 312a and a second electrode 312b. The first electrode 312a and the second electrode 312b may be both disposed on the first surface 310a, both disposed on the second surface 310b, or separately disposed on the first surface 310a and the second surface 310b. In the embodiment shown in FIG. 3E, the first electrode 312a and the second electrode 312b are separately disposed on the first surface 310a and the second surface 310b, respectively.

The chip 310 may be the same as or similar to the chip 210 described in the embodiment shown in FIG. 2E. In this embodiment, the chip 310 is, for example, a light emitting diode chip, wherein the first electrode 312a has a conductivity opposite to that of the second electrode 312b. In one embodiment, the first electrode 312a is a p-type electrode and the second electrode 312b is an n-type electrode. In another embodiment, the first electrode 312a is an n-type electrode and the second electrode 312b is a p-type electrode.

In this embodiment, when the third conducting structure is a single via, the third conducting structure is located under the cavity. The hole conducting layer 306c' in the single via may not only provide the conducting route from the second electrode 312b to the lower surface 300b of the carrier substrate 300, but also help to dissipate the heat generated by the chip 310 during operation, thus improving the performance of the chip.

In this embodiment, although the lower hole and the lower hole conducting layer is formed before the forming of the upper hole and the upper hole conducting layer, embodiments of the invention are not limited thereto. In another embodiment, the upper hole and the upper hole conducting layer is formed before the forming of the lower hole and the lower hole conducting layer. Because the chip is disposed on the bottom portion of the cavity, the heat conducting distance between the chip and the lower surface of the carrier substrate may be reduced. Thus, heat accumulation problems below the chip may be reduced. When the conducting layer substantially fills the through-hole, the conducting layer may also serve as a heat conducting post.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A package structure for chip, comprising:
   a semiconductor carrier substrate having an upper surface and an opposite lower surface;
   a chip overlying the semiconductor carrier substrate and having a first surface and an opposite second surface facing the upper surface, wherein the chip comprises at least a first electrode and a second electrode;
   a first conducting structure overlying the semiconductor carrier substrate and electrically connecting the first electrode;
   a second conducting structure overlying the semiconductor carrier substrate and electrically connecting the second electrode;
   a first through-hole comprising a stacked hole in the semiconductor carrier substrate and penetrating the upper surface at an upper opening of the semiconductor carrier substrate and the lower surface at a lower opening of the semiconductor carrier substrate and disposed next to the chip, wherein the stacked hole comprises a first lower hole and a first upper hole stacked thereon;
   a first conducting layer overlying a sidewall of the first through-hole and electrically connecting the first conducting structure, wherein there remains an upper space within the first through-hole which is not filled to the upper opening by any electrically conductive material and a lower space within the first through-hole which is not filled to the lower opening by any electrically conductive material;
   a first middle conducting layer located at an interface between the first upper hole and the first lower hole and electrically connected to the first conducting layer overlying the sidewall of the first through-hole, wherein the first middle conducting layer completely separates the first upper hole and the first lower hole; and
   a third conducting structure comprising a second through-hole and overlying the semiconductor carrier substrate and electrically connecting the second conducting structure.

2. The package structure for chip as claimed in claim 1, further comprising a first insulating layer between the sidewall of the first through-hole and the first conducting layer.

3. The package structure for chip as claimed in claim 1, wherein the first electrode is disposed on the first surface of the chip and the second electrode is disposed on the second surface of the chip.

4. The package structure for chip as claimed in claim 1, wherein the second conducting structure comprises a redistribution layer.

5. A package structure for chip, comprising:
   a carrier substrate having an upper surface and an opposite lower surface;
   a chip overlying the carrier substrate and having a first surface and an opposite second surface facing the upper surface, wherein the chip comprises at least a first electrode and a second electrode;
   a first conducting structure overlying the carrier substrate and electrically connecting the first electrode, wherein the first conducting structure comprises a bonding wire;
   a second conducting structure overlying the carrier substrate and electrically connecting the second electrode;
   a first through-hole comprising a stacked hole and penetrating the upper surface and the lower surface of the carrier substrate and disposed next to the chip;
   a first conducting layer overlying a sidewall of the first through-hole and electrically connecting the first conducting structure; and
   a third conducting structure comprising a second through-hole and overlying the carrier substrate and electrically connecting the second conducting structure.

6. The package structure for chip as claimed in claim 1, wherein the second through-hole of the third conducting structure comprises a stack hole, and a second conducting layer is located overlying a sidewall of the second through-hole and electrically connected to the second conducting structure.

7. The package structure for chip as claimed in claim 6, wherein the second through-hole comprises a second lower hole and a second upper hole stacked thereon.

8. The package structure for chip as claimed in claim 7, further comprising a second middle conducting layer located at an interface between the second upper hole and the second lower hole and electrically connected to the second conducting layer overlying the sidewall of the second through-hole.

9. The package structure for chip as claimed in claim 7, wherein the semiconductor carrier substrate comprises a cavity, and the chip is located on a bottom portion of the cavity.

10. The package structure for chip as claimed in claim 9, wherein the second through-hole of the third conducting structure penetrates the lower surface of the semiconductor carrier substrate and exposes the bottom portion of the cavity; and
   a second conducting layer is located overlying the sidewall of the second through-hole and electrically connecting the second conducting structure.

11. The package structure for chip as claimed in 10, further comprising a second insulating layer between the sidewall of the second through-hole and the second conducting electrode.

12. The package structure for chip as claimed in claim 1, wherein the first middle conducting layer is bounded by the upper space and the lower space of the first through-hole.

13. The package structure for chip as claimed in claim 1, wherein the first middle conducting layer comprises two stacked conducting layers.

14. A package structure for chip, comprising:
   a carrier substrate having an upper surface and an opposite lower surface, wherein the carrier substrate comprises a semiconductor substrate;
   a chip overlying the carrier substrate and having a first surface and an opposite second surface facing the upper surface, wherein the chip comprises at least a first electrode and a second electrode;

a first conducting structure overlying the carrier substrate and electrically connecting the first electrode;

a second conducting structure overlying the carrier substrate and electrically connecting the second electrode;

a first through-hole comprising a stacked hole in the carrier substrate and penetrating the upper surface and the lower surface of the carrier substrate and disposed next to the chip, wherein the stacked hole comprises a first lower hole and a first upper hole stacked thereon;

a first conducting layer overlying a sidewall of the first through-hole and electrically connecting the first conducting structure;

a first middle conducting layer located at an interface between the first upper hole and the first lower hole and electrically connected to the first conducting layer overlying the sidewall of the first through-hole, wherein the first middle conducting layer completely separates the first upper hole and the first lower hole; and a third conducting structure comprising a second through-hole and overlying the carrier substrate and electrically connecting the second conducting structure.

15. The package structure for chip as claimed in claim 14, wherein the carrier substrate is a single substrate.

16. The package structure for chip as claimed in claim 14, wherein the stacked hole of the first through-hole in the carrier substrate is not under the chip.

17. The package structure for chip as claimed in claim 14, wherein the first middle conducting layer comprises two stacked conducting layers.

18. The package structure for chip as claimed in claim 14, wherein the first conducting structure comprises a bonding wire.

19. The package structure for chip as claimed in claim 14, wherein the first through-hole penetrates the upper surface of the carrier substrate at an upper opening and the lower surface of the carrier substrate at a lower opening of the carrier substrate;

and wherein there remains an upper space within the first through-hole which is not filled to the upper opening by any electrically conductive material and a lower space within the first through-hole which is not filled to the lower opening by any electrically conductive material.

20. The package structure for chip as claimed in claim 1, wherein the first conducting structure comprises a bonding wire.

* * * * *